United States Patent [19]

Suzuki et al.

[11] Patent Number: 4,690,880

[45] Date of Patent: Sep. 1, 1987

[54] PATTERN FORMING METHOD

[75] Inventors: Hideyuki Suzuki, Machida; Katsunori Terada, Sagamihara; Yuichi Masaki, Kawasaki; Kenji Morimoto, Ise, all of Japan

[73] Assignee: Canon Kabushiki Kaisha, Tokyo, Japan

[21] Appl. No.: 860,698

[22] Filed: May 5, 1986

Related U.S. Application Data

[63] Continuation of Ser. No. 755,463, Jul. 16, 1985, abandoned.

[30] Foreign Application Priority Data

Jul. 20, 1984 [JP] Japan ................................ 59-149660
Jul. 23, 1984 [JP] Japan ................................ 59-151382

[51] Int. Cl.⁴ .......................... G03C 5/00; G03F 9/00
[52] U.S. Cl. .................................... 430/313; 430/22; 430/323; 430/329; 430/394
[58] Field of Search ................. 430/22, 313, 323, 329, 430/394

[56] References Cited

U.S. PATENT DOCUMENTS

| | | | |
|---|---|---|---|
| 4,357,369 | 11/1982 | Kilichowski et al. | 427/90 |
| 4,367,281 | 1/1913 | Shibayama et al. | 430/313 |
| 4,377,627 | 3/1983 | Vinton | 430/22 |
| 4,436,806 | 3/1984 | Rendulic et al. | 430/311 |
| 4,508,802 | 4/1985 | Heiart et al. | 430/22 |
| 4,518,667 | 5/1985 | Heiart et al. | 430/22 |
| 4,522,903 | 6/1985 | Heiart et al. | 430/22 |

Primary Examiner—John E. Kittle
Assistant Examiner—Patrick J. Ryan
Attorney, Agent, or Firm—Fitzpatrick, Cella, Harper & Scinto

[57] ABSTRACT

A method of forming a pattern on a surface of a workpiece. The workpiece surface is coated with photoresist. Part of the coated workpiece surface is exposed and developed to form an alignment mark. An unexposed portion of the photoresist coated workpiece surface is then exposed, developed and etched.

13 Claims, 6 Drawing Figures

PATTERN FORMING METHOD

This application is a continuation of application Ser. No. 755,463 filed on 7/16/85 now abandoned.

BACKGROUND OF THE INVENTION

1. Field of the Invention

The present invention relates to methods of forming a pattern on a workpiece by etching the surface of the workpiece, and more particularly to methods especially suitable for forming a pattern on the surface of a strip workpiece.

2. Description of the Prior Art

Manufacture of various articles by etching of the surfaces of workpiece using lithography technique is extensively used in industrial fields, especially in an electronic manufacturing field. According to this process, articles having the same pattern can be mass-produced. In this case, the surface of workpieces are coated with photoresist, the coated photoresist are exposed through a desired pattern and then developed. The surfaces of the workpieces are then etched using the exposed resist as a mask.

However, if the workpieces is a strip workpiece, example a strip image sensor, pattern exposure can not often be effected at a stroke due to restrictions on an exposure device, etc. Thus, in this case, division exposure is performed, i.e. two or more portions into which the pattern surface is divided are exposed one at a time. In order to perform an offsetless pattern formation using a plurality of the division exposure steps, an alignment mark will be formed in advance to the surface of the workpiece.

More particularly, for example, an A 1 film, covering a surface of a workpiece, is coated with photoresist, exposed through an alignment mark pattern and developed. A small portion of the A 1 film containing the mark pattern is etched to remove the photoresist in the small portion and form an alignment mark. The workpiece is then washed and coated with photoresist again. One half of the workpiece extending from the alignment mark in one direction is exposed through one half of a strip pattern and the other half of the workpiece extending from the alignment mark in the opposite direction to the one direction mentioned above is exposed through the other half of the strip pattern. The workpiece is then developed and etched to form a pattern on the workpiece. Finally the photoresist is removed. A flowchart of the steps of this conventional pattern forming process is shown in FIG. 3. However, this process includes relatively many steps, thereby resulting in a low yield.

SUMMARY OF THE INVENTION

In view of the above conventional technique, it is the object of the present invention to decrease the number of steps of forming a pattern on the workpiece, thereby resulting in a high yield and forming the pattern efficiently in a relatively short time.

Another object of the present invention is to provide a method of forming a pattern on a surface of a workpiece comprising the steps of coating the workpiece surface with photoresist, developing and etching the coated workpiece surface, the method comprising the steps of coating the workpiece surface with photoresist, exposing part of the coated workpiece surface, developing the exposed surface part etching the developed surface part, then exposing the unexposed photoresist portion, developing the just exposed photoresist portion, and etching the photoresist portion thus obtained.

Still another object of the present invention is to provide a method of forming a pattern in a surface of a workpiece comprising the steps of coating the workpiece surface with photoresist, exposing, developing and etching the coated workpiece surface, the method including the steps of coating the workpiece surface with photoresist, exposing part of the coated workpiece surface, developing the exposed surface part, then exposing the unexposed photoresist portion, developing the just exposed photoresist and etching the workpiece thus obtained.

BREIF DESCRIPTION OF THE DRAWINGS

DETAILED DESCTIPTION OF PREFFED EMBODIMENTS

Now an embodiment of a method according to the invention will be described.

Figure 1A:
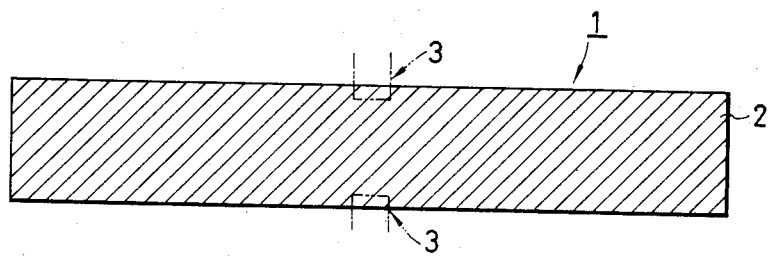
FIG. 1 is plan views of a workpiece to which the respective steps of a method according to the present invention are applied.
Figure 1B:
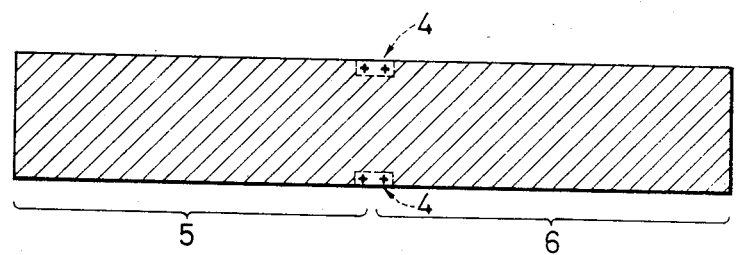
Figure 1C:
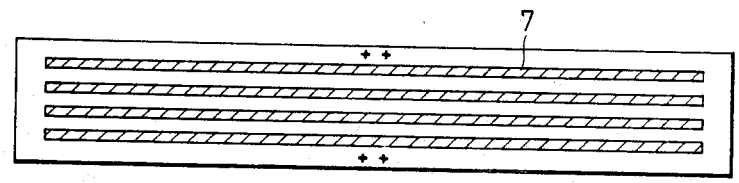

FIG. 1 illustrates the steps of a pattern forming method according to the present invention performed on a workpiece which is shown in corresponding plan views. As the workpiece, for example, a glass substrate coated with A 1 to a thickness of the order of 5,000 Å is used. FIG. A 1 is a plan view of such a workpiece wherein reference numeral 1 denotes the workpiece and reference numeral 2 denotes the A 1 film provided on the workpiece surface. Now, the pattern forming method according to the present invention will be described with respect to a first embodiment thereof.

First, the surface of the workpiece is coated with positive acting photoresist (Tokyo Oka's "OFPR-800" (tradename)) to a thickness of the order of 1–1.5 nm. Then only a portion of the coated workpiece surface on which an alignment mark is to be formed (3 in FIG. 1 A) is exposed through a desired alignment mark pattern for about 20 seconds. The exposed workpiece surface is developed with developing solution (Tokyo Oka's NMD-3 (tradename)) for 30–40 seconds. The developed surface is etched for 0–90 seconds with etching solution having a compounding ratio of 16 phosphoric acid: 1 nitric acid : 2 acetic acid : 1 water to form an A 1 alignment mark 4 on the surface of workpiece 1, as shown in FIG. 1 B.

A half of the unexposed workpiece portion, shown by 5 in FIG. 1 B, extending from alignment mark 4 in one direction is exposed through a desired pattern for about 30 seconds. The workpiece 1 is then moved. The remaining unexposed half 6 extending from alignment mark 4 in the opposite direction to said one direction is exposed through a desired pattern for about 30 seconds. The resulting workpiece is developed with the developing solution for 40–50 seconds and then etched with the etching solution for 60–90 seconds. Finally, the photoresist is removed to form a strip pattern 7 as shown in FIG. 1 C.

Figure 2:
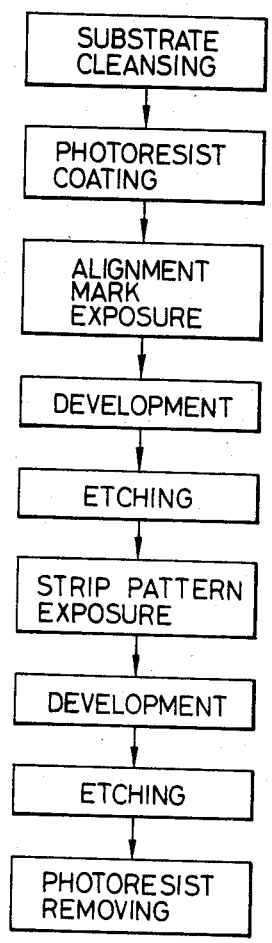
FIGS. 2 and 4 are flowcharts of the methods according to the present invention.
Figure 3:
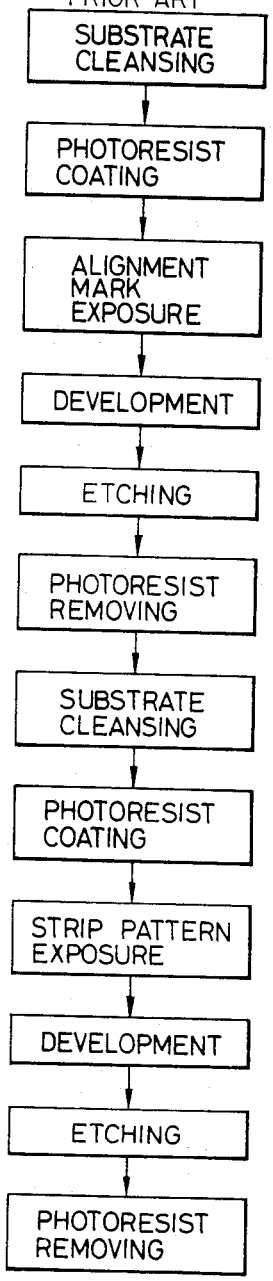
FIG. 3 is a flowchart of a conventional pattern forming method.

A flowchart of such pattern forming process is shown in FIG. 2.

Now a second embodiment of the present invention will be described. The surface of workpiece 1 is coated with positive acting photoresist (Tokyo Oka's "OFPR-800" (tradename)) to a thickness of 1–1.5 nm. Then only a portion of the coated workpiece surface on which an alignment mark is to be formed (3 in FIG. 1 A) is exposed through a desired alignment mark pattern for about 20 seconds. The exposed workpiece surface is developed with developing solution (Tokyo Oka's NMD-3 (tradename)) for about 30–40 seconds to form an alignment mark 4 on the surface of workpiece 1, as shown in FIG. 1 B.

Next, a half of the unexposed workpiece portion, shown by 5 in FIG. 1 B, extending from alignment mark 4 in one direction is exposed through a desired pattern for about 30 seconds. The workpiece is then moved and the remaining unexposed half 6 extending from alignment mark 6 in the opposite direction to the one direction mentioned before is exposed through a desired pattern for about 30 seconds. The resulting workpiece is developed with the developing solution for 40–50 seconds and then etched with etching solution having a compounding ratio of 16 (phosphoric acid): 1 (nitric acid): 2 (acetic acid): 1 (water) to remove the photoresist finally, thereby forming a strip pattern 7 as shown in FIG. 1 C.

Figure 4:
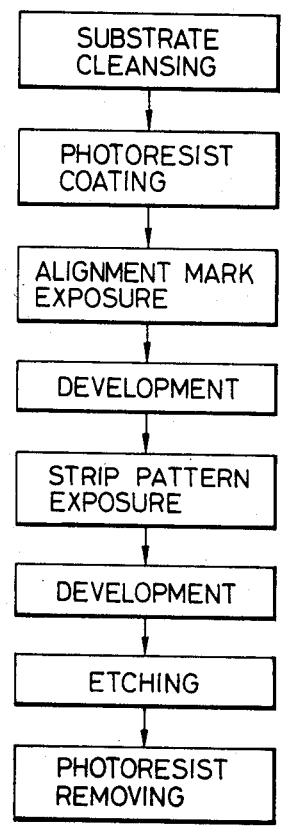

A flowchart of this pattern forming process is shown in FIG. 4.

While in the above embodiments the formation of a strip pattern has been illustrated, it should be noted that the inventive method may be applied to the formation of any patterns.

According to the present invention, as illustrated above the steps of washing the substrate, coating the substrate with photoresist and etching the substrate are only required to be performed once, thereby reserving washing liquid, photoresist and removing liquid and reducing the process steps and increasing the yield of the resulting products.

We claim:

1. A method of forming a pattern on a surface of a workpiece, comprising the steps of coating the workpiece surface with photoresist, imagewise exposing, developing and etching the coated workpiece surface, said further particularly method including the steps of coating the workpiece surface with photoresist, first imagewise exposing part of the photoresist coated surface, developing the just exposed part, then imagewise exposing the unexposed portion of the coated photoresist, developing the just exposed photoresist portion and etching the workpiece.

2. A method of forming a pattern on a surface of a workpiece, comprising the steps of coating the workpiece surface with photoresist, imagewise exposing, developing and etching the coated workpiece surface, said method further particularly including the steps of coating the workpiece surface with photoresist, first imagewise exposing part of the photoresist coated surface, developing the just exposed part, etching the just developed part, then imagewise exposing an unexposed portion of the coated photoresist, developing the just exposed unexposed portion, and etching the just etched part.

3. A method according to claim 1, wherein part of the photoresist coated workpiece surface to be first exposed and developed involves an alignment mark.

4. A method according to claim 2 wherein part of the photresist coated workpiece surface to be first exposed and developed involves an alignment mark.

5. A method according to claim 1, further comprising the step of cleansing the workpiece before coating the workpiece surface with photoresist, wherein said cleansing step is performed only once.

6. A method according to claim 2, further comprising the step of cleansing the workpiece before coating the workpiece surface with photoresist, wherein said cleansing step is performed only once.

7. A method according to claim 1, wherein said first exposing step comprises the step of exposing part of the photoresist coated surface with radiation through an alignment mark pattern to produce an alignment mark on said surface, wherein said unexposed portion exposing step comprises the steps of: exposing a portion of said unexposed portion from said alignment mark to one end of said surface and then exposing the portion of said unexposed portion from said alignment mark to the other end of said surface.

8. A method according to claim 7, wherein said unexposed portion exposing step further comprises the step of displacing said workpiece after said step of exposing a portion of said unexposed portion from said alignment mark to one end of said surface and before said step of exposing the portion of said unexposed portion from said alignment mark to the other end of said surface.

9. A method according to claim 2, wherein said first exposing step comprises the step of exposing part of the photoresist coated surface with radiation through an alignment mark pattern to produce an alignment mark on said surface, wherein said unexposed portion exposing step comprises the steps of: exposing a portion of said unexposed portion from said alignment mark to one end of said surface and then exposing the portion of said unexposed portion from said alignment mark to the other end of said surface.

10. A method according to claim 9, wherein said unexposed portion exposing step further comprises the step of displacing said workpiece after said step of exposing a portion of said unexposed portion from said alignment mark to one end of said surface and before said step of exposing the portion of said unexposed portion from said alighment mark to the other end of said surface.

11. A method according to claim 1, wherein said coating step is performed only once.

12. A method according to claim 2, wherein said coating step is performed only once.

13. A method according to calim 1, wherein said etching step is performed only once.

* * * * *

UNITED STATES PATENT AND TRADEMARK OFFICE
CERTIFICATE OF CORRECTION

PATENT NO. : 4,690,880
DATED : September 1, 1987
INVENTOR(S) : HIDEYUKI SUZUKI, ET AL.

Page 1 of 2

It is certified that error appears in the above-identified patent and that said Letters Patent is hereby corrected as shown below:

On the Title Page:

AT [56] IN REFERENCES CITED/U.S. PATENT DOCUMENTS

Line 2, "4,367,281  1/1913 Shibayama et al....430/313" should read
--4,367,281  1/1983 Shibayama et al....430/313--.

COLUMN 1

Line 25, "workpieces" should read --workpiece--.
Line 26, "example" should read --for example--.
Line 58, "yicld" should read --yield--.
Line 67, "part etching" should read --part, etching--.

COLUMN 2

Line 4, "in" should read --on--.
Line 14, "BREIF" should read --BRIEF--.
Line 23, "DETAILED DESCTIPTION OF PREFFED" should read
--DETAILED DESCRIPTION OF THE PREFERRED--.
Line 33, "FIG. A 1" should read --FIG. 1A--.

COLUMN 3

Line 16, "6" should read --4--.
Line 32, "above the" should read --above, the--.
Line 43, "said further particularly method" should read
--said method further particularly--.

UNITED STATES PATENT AND TRADEMARK OFFICE
CERTIFICATE OF CORRECTION

PATENT NO. : 4,690,880
DATED : September 1, 1987
INVENTOR(S) : HIDEYUKI SUZUKI, ET AL.

It is certified that error appears in the above-identified patent and that said Letters Patent is hereby corrected as shown below:

COLUMN 4

Line 6,   "2 wherein" should read --2, wherein--.
    Line 51,  "alighment" should read --alignment--.
    Line 57,  "calim 1," should read --claim 1,--.

Signed and Sealed this

Ninth Day of February, 1988

Attest:

DONALD J. QUIGG

*Attesting Officer*    *Commissioner of Patents and Trademarks*